United States Patent [19]

Neugebauer et al.

[11] Patent Number: 5,018,002

[45] Date of Patent: May 21, 1991

[54] HIGH CURRENT HERMETIC PACKAGE INCLUDING AN INTERNAL FOIL AND HAVING A LEAD EXTENDING THROUGH THE PACKAGE LID AND A PACKAGED SEMICONDUCTOR CHIP

[75] Inventors: Constantine A. Neugebauer; Wolfgang Daum, both of Schenectady, N.Y.

[73] Assignee: General Electric Company, Schenectady, N.Y.

[21] Appl. No.: 375,641

[22] Filed: Jul. 3, 1989

[51] Int. Cl.$^5$ .................................. H01L 23/48
[52] U.S. Cl. ................................ 357/68; 357/74
[58] Field of Search ............................ 357/68, 74

[56] References Cited

U.S. PATENT DOCUMENTS

| 3,740,619 | 6/1973 | Rosvold | 317/234 R |
| 4,386,362 | 5/1983 | Kessler, Jr. et al. | 357/68 |
| 4,453,176 | 6/1984 | Chance et al. | 357/68 |
| 4,503,597 | 3/1985 | Kushima et al. | 357/68 |
| 4,667,219 | 5/1987 | Lee et al. | 357/68 |
| 4,667,220 | 5/1987 | Lee et al. | 357/68 |
| 4,750,666 | 6/1988 | Neugebauer et al. | 228/160 |
| 4,807,021 | 2/1989 | Okumura | 357/68 |
| 4,905,075 | 2/1990 | Temple et al. | 357/74 |
| 4,918,514 | 4/1990 | Matsuda et al. | 357/74 |

FOREIGN PATENT DOCUMENTS

| 52-40973 | 3/1977 | Japan | 357/68 |
| 55-123155 | 9/1980 | Japan | 357/68 |
| WO87/00686 | 1/1987 | PCT Int'l Appl. | 357/68 |

OTHER PUBLICATIONS

Technical Notes, A Publication of RCA, TN No.: 851, Oct. 16, 1969, "Improved Contact Means for Multi-Emitter Power Transistors" by Richard Denning.

IBM Technical Disclosure Bulletin, vol. 22, No. 2, Jul. 1979, "Via Joint with Reduced Thermal Gradients" by M. D. Reeder, p. 563.

Primary Examiner—Rolf Hille
Assistant Examiner—Steven Lake
Attorney, Agent, or Firm—Marvin Snyder; James C. Davis, Jr.

[57] ABSTRACT

A hermetic semiconductor chip package includes a conductive foil bonded to a contact pad of the chip and connected to an external lead of the package through an aperture in the insulating material of the package lid.

27 Claims, 14 Drawing Sheets

HIGH CURRENT HERMETIC PACKAGE INCLUDING AN INTERNAL FOIL AND HAVING A LEAD EXTENDING THROUGH THE PACKAGE LID AND A PACKAGED SEMICONDUCTOR CHIP

RELATED APPLICATIONS

The present application is related to application Ser. No. 07/367,525 filed June 16, 1989, entitled "Hermetic Package Having a Lead Extending Through the Package Lid and a Packaged Semiconductor Chip", by V. A. K. Temple et al. and to application Ser. No. 07,375,569 filed July 3, 1989, entitled "High Current Hermetic Package Having a Lead Extending Through the Package Lid and a Packaged Semiconductor Chip", by C. A. Neugebauer et al. Each of these applications is incorporated herein by reference.

This invention was made with Government support under contract N61533-89-C-0004 awarded by DARPA. The Government has certain rights in this invention.

BACKGROUND OF THE INVENTION

1. Field of the Invention

The present invention relates to the field of packages for semiconductor devices and packaged devices, and more particularly, to the field of high current hermetic packages and hermetically packaged high current devices.

2. Background Information

Semiconductor devices have been packaged in a vast variety of package configurations. These include both hermetic (gas-tight) and non-hermetic (gas-permeable) packages. As the desired operating frequency of hermetically packaged power devices is increased, a number of problems develop with prior art packages. Prior art hermetic packages for power devices generally include a metallic case or can. Such metallic cans have device leads which extend through glass seals in the sides of the can. These glass seals bond to both the lead and the material of the can in order to hermetically seal the passage of each lead through the can. The chip in which the device is contained is normally bonded to the bottom of the can and the contact pads on the top of the device are connected to the through-the-can leads by wire bonds. After the completion of mounting and bonding the chip, a cover or lid is sealed on top of the can to hermetically seal the package. Such packages present a number of disadvantages. First, since the wire bonds are normally made with round wire on the order of about 1 mil (0.025 mm) in diameter for low power integrated circuits and 30-40 mils (0.76-1.02 mm) in diameter for power or high current devices and are about 0.3-0.5 inch (0.76-1.27 cm) long, they have a significant inductance in their own right. Second, the through-the-can leads are round wires about 20-50 mils (1-3 mm) in diameter and about 0.3-0.5 inch (0.76-1.27 cm) long. Thus, these leads also have a significant inductance in their own right. Third, the wires have a significant resistance which adds to the on-resistance of the device. Fourth, in order for the coefficient of thermal expansion of the can and the semiconductor device to be sufficiently equal that the device does not become debonded from the can and to prolong the life of the glass seals, the cans are normally made of Kovar ® or Invar ® or other similar low expansion coefficient metals. Such metals are magnetic materials and consequently, have the effect of increasing the inductance of the bond wires and of the through-the-can leads. Fifth, glass seals are unreliable over long periods of time and eventually begin to leak. Sixth, the metals used in the can and leads suffer from higher electrical and thermal resistivity than copper. Seventh, such packages have the disadvantage that they are substantially larger both in major surface area and volume than the semiconductor chip and weigh many times what the chip weighs. The net result, is that the final packaged chip is in a heavy, bulky container which has a relatively high inductance. That relatively high inductance is undesirable for high frequency operation of the device, because when coupled with the very high di/dt characteristic of high frequency operation, this inductance leads to very large Ldi/dt voltage disturbances such as overshoots and undershoots, where L is the lead inductance. This problem increases with increasing frequency of operation because inductive effects increase with increasing signal frequency.

A further problem which is encountered with the packaging of high current devices is that where a single wire bond connects a contact pad to the lead of the can, all of the current flowing through that lead enters the contact pad at the bond between the wire and the pad. Where the contact pad contacts a substantial area of the semiconductor device, substantial lateral currents must flow in the contact pad to distribute the current throughout the device. This has the disadvantage that for high current devices, the current carrying capacity of a thin contact pad can easily be exceeded in the vicinity of the wire bond.

The above-identified related application Ser. No. 07/367,525 discloses a package which overcomes the inductance and size problems of the prior art hermetic packages. However, the provisions of its preferred embodiment for limiting lateral current flow in the contact pad of the device can be improved upon. The above-identified application Ser. No. 07/375,569 provides a structure which limits lateral current flow, but is more complex to assemble the preferred application Ser. No. 07/367,525 structure.

Consequently, there is a need for a compact, hermetic, non-magnetic package for high frequency, high current power devices which limits lateral currents in chip contact pads without requiring unduly complex assembly.

OBJECTS OF THE INVENTION

Accordingly, a primary object of the present invention is to provide a hermetically sealed, easily assembled package for power semiconductor devices which is lightweight, free of magnetic materials and avoids the problem of inducing high lateral currents in device contact pads.

SUMMARY OF THE INVENTION

The above and other objects which will become apparent from the specification as a whole, including the drawings, are accomplished in accordance with a preferred embodiment of the present invention by a semiconductor device package in which a conductive foil is bonded to a contact pad of the semiconductor device within the package and provided with a protrusion which extends into an aperture in the lid of the package to connect the contact pad to external conductors. The foil provides a high current capacity, low resistance path disposed in electrical parallel with the lateral current path within the device contact pad. The protrusion on the foil which extends into an aperture in the lid connects the foil to an external conductor to connect the device in an external circuit. The aperture in the lid is preferably sealed by a second foil bonded to the lid and extending across the aperture on the outside of the lid to provide a hermetic seal. The conductive projection of the internal foil may be integral with the foil or may be a separate conductive pellet which is bonded to the foil.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

In particular, FIG. 1 is a plan view of a semiconductor chip suitable for packaging in accordance with the present invention;

FIG. 2 illustrates the chip of FIG. 1 with conductive bumps bonded to the contact pads thereof;

FIG. 3 illustrates a conductive foil suitable for bonding to the large contact pad of the device in FIG. 2;

FIG. 4 illustrates the chip ready for assembly to a package lid;

FIGS. 5 and 6 are cross-sections through the chip and internal foil of FIG. 4 showing alternative configurations;

FIG. 7 is a perspective view of the outside of a package lid suitable for use in the present invention;

FIG. 8 is a perspective view of the inside of the package lid of FIG. 7;

FIG. 9 is a perspective view of the chip of FIG. 4 inverted and inserted in the lid of FIG. 8;

FIG. 10 is a perspective view of a package base suitable for use in the present invention;

DETAILED DESCRIPTION

Figure 10:
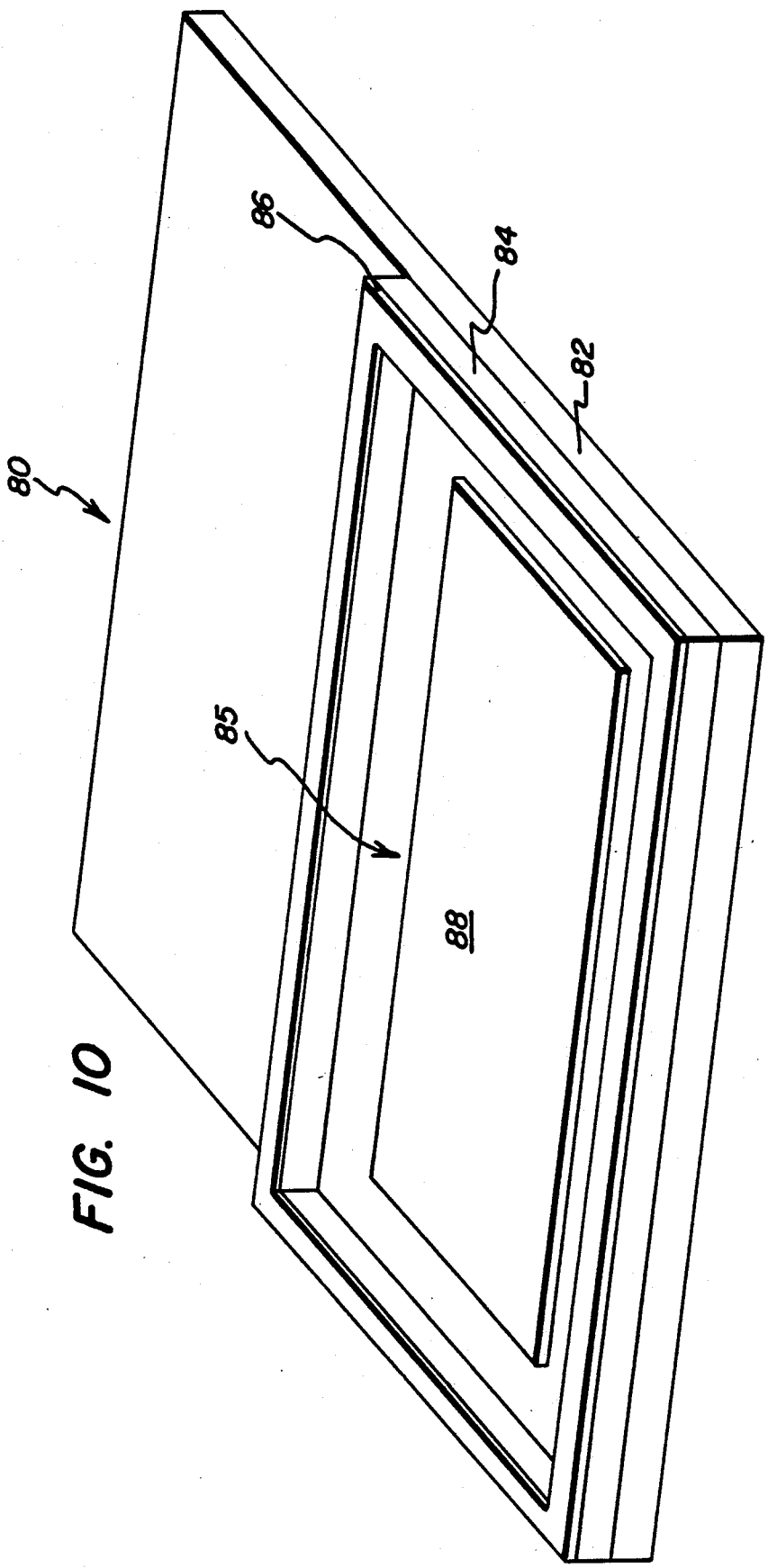
Figure 11:
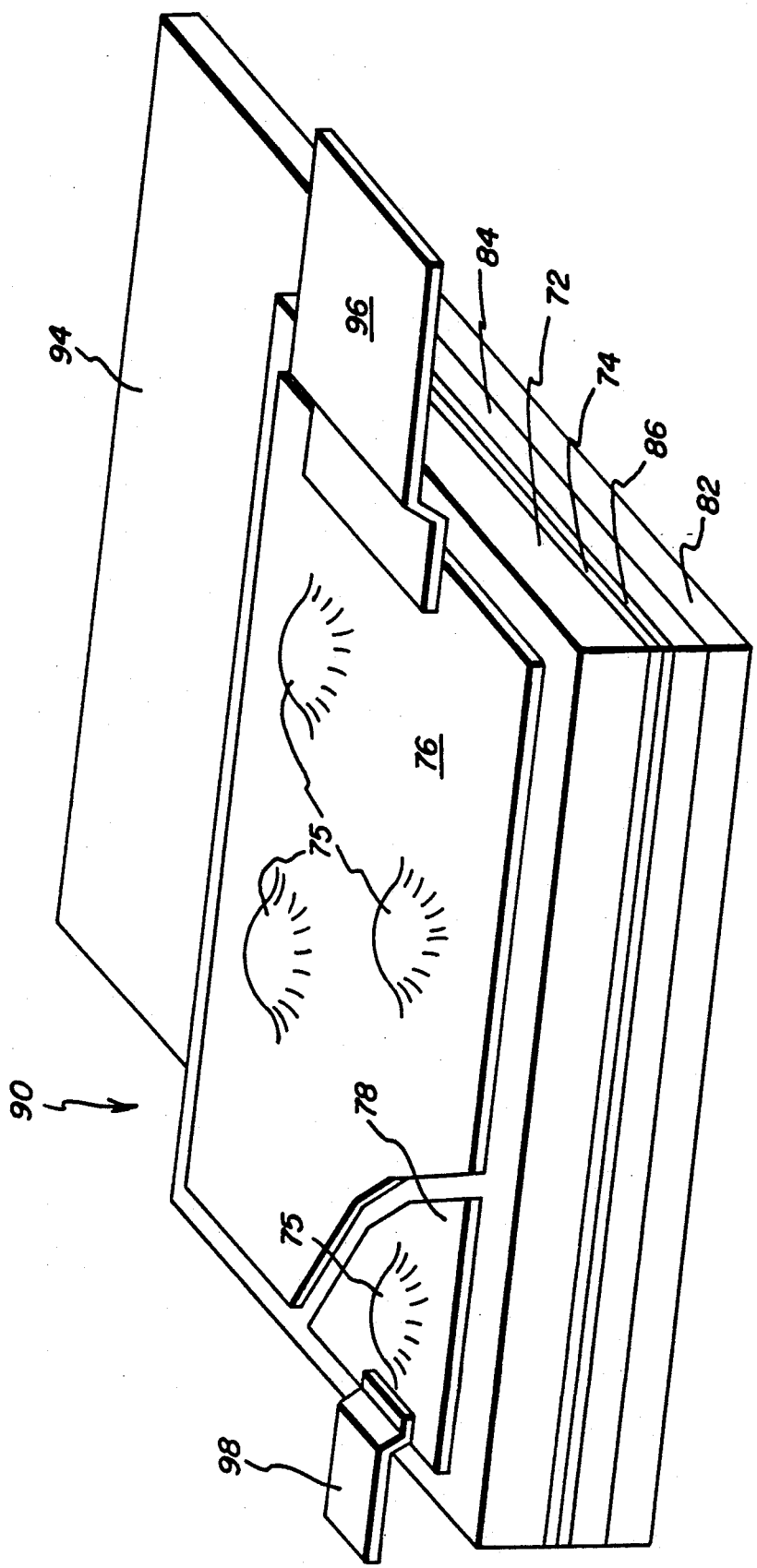
FIG. 11 is a perspective view of the packaged semiconductor device.
Figure 12:
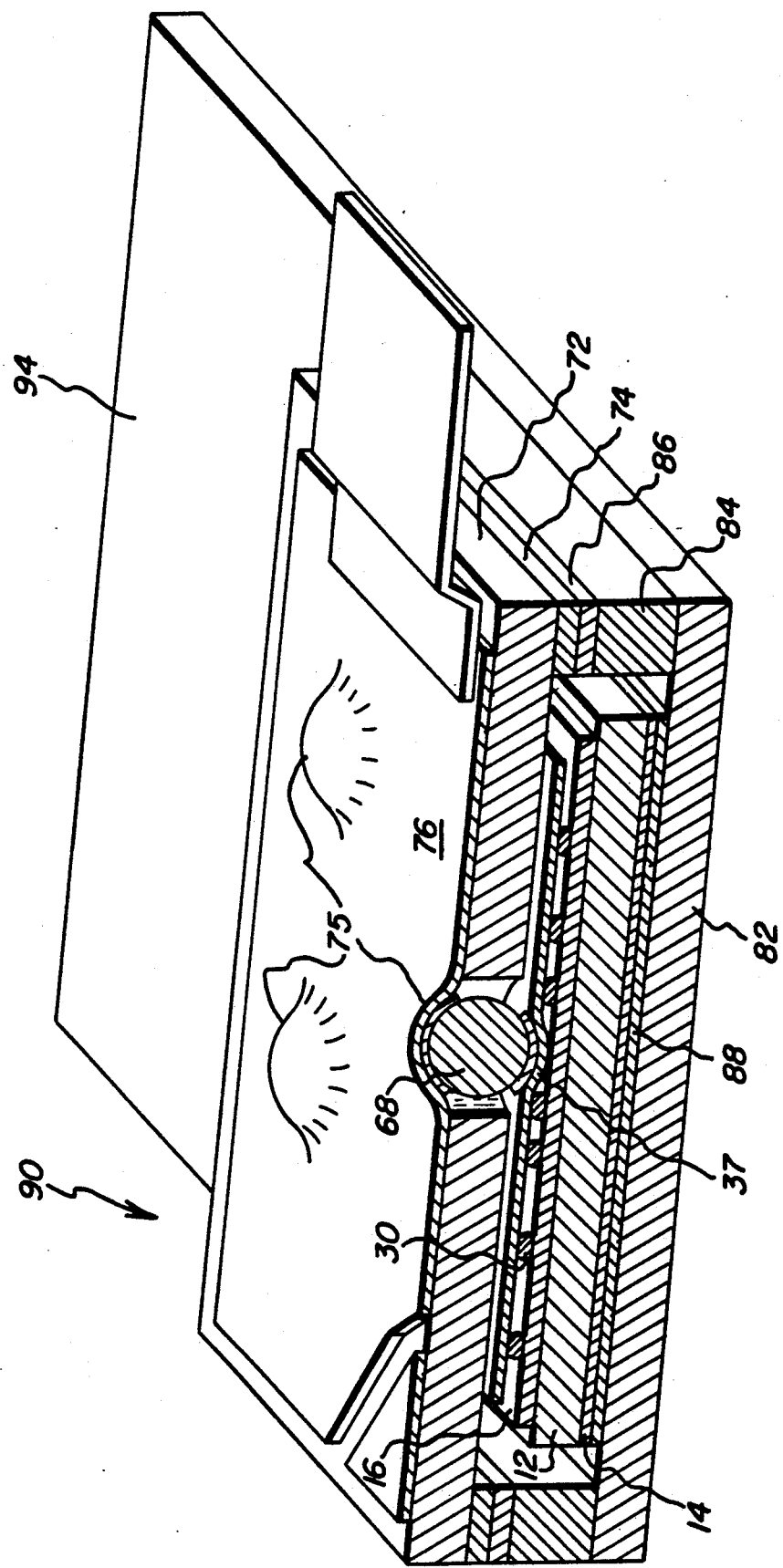
FIG. 12 is a perspective cross-section through the FIG. 11 structure.

A completed packaged semiconductor device in accordance with one embodiment of the present invention is illustrated generally at 90 in FIG. 11 in a perspective view and in FIG. 12 in a perspective cross-section view. The component parts and the process of fabricating the package 90 will now be described in connection with FIGS. 1-12.

Figure 1:
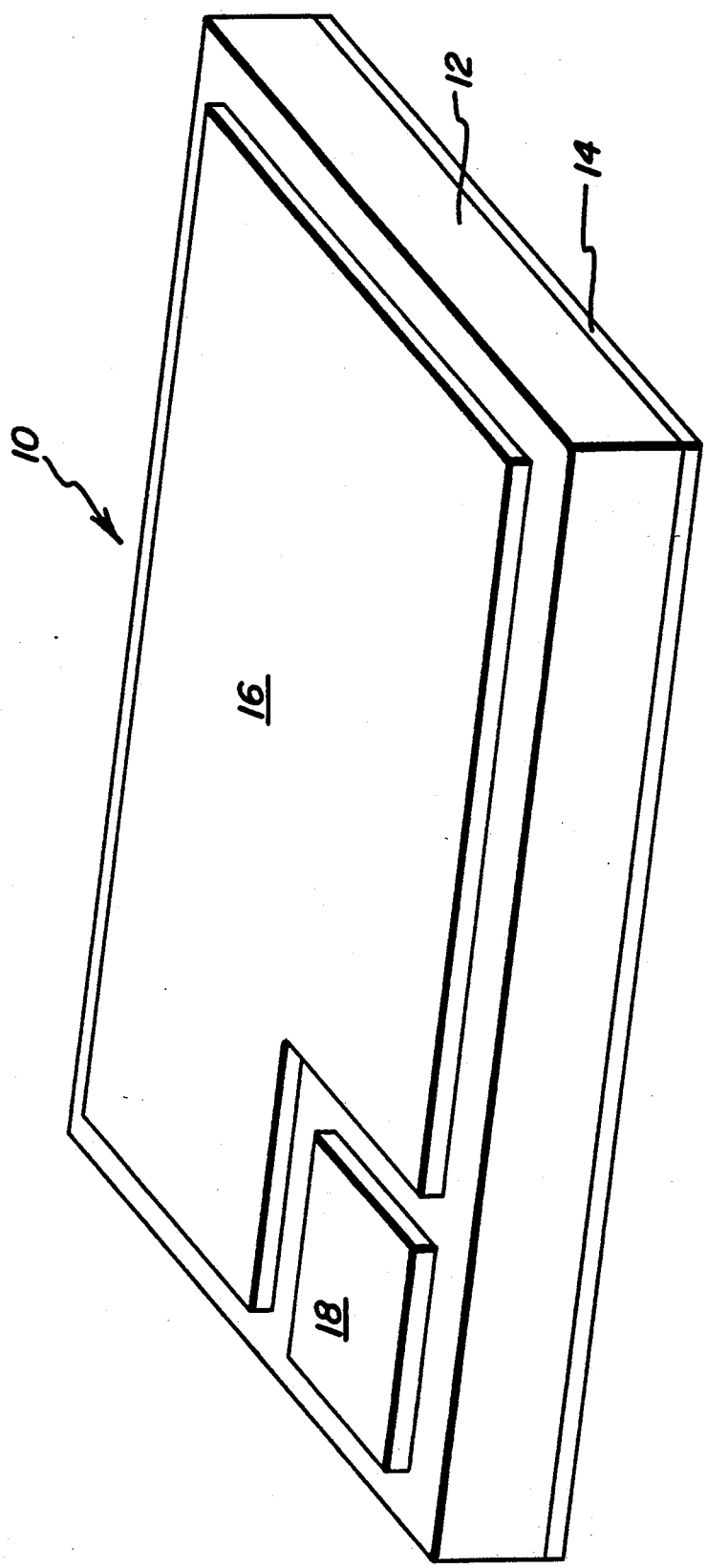
FIGS. 1-10 illustrate successive steps in the process of packaging a device in accordance with the present invention.

In FIG. 1, a semiconductor chip 10 suitable for packaging in accordance with the present invention is illustrated in a perspective view. The chip 10 comprises a body 12 of semiconductor material having a solderable metallization 14 disposed on the lower or back surface thereof and having two contact pads 16 and 18 disposed on the upper or front surface thereof. Where the device is a field effect transistor or an MOS controlled thyristor (MCT), the metallization 14 serves as drain contact, the contact pad 16 serves as the source contact and contact pad 18 serves as the gate contact. Thus the metallization 14 and contact pad 16 serve as the power electrodes of the device, while the relatively small contact pad 18 serves as the control contact for the device. The contact pads 16 and 18 are typically aluminum in such devices and thus are not directly solderable with common solders. In contrast, the metallization 14 is normally provided with a solderable surface in order that the chip may be soldered to a package base or heat sink. In accordance with the present invention, the contact pads 16 and 18 may be either solderable or non-solderable.

Figure 2:
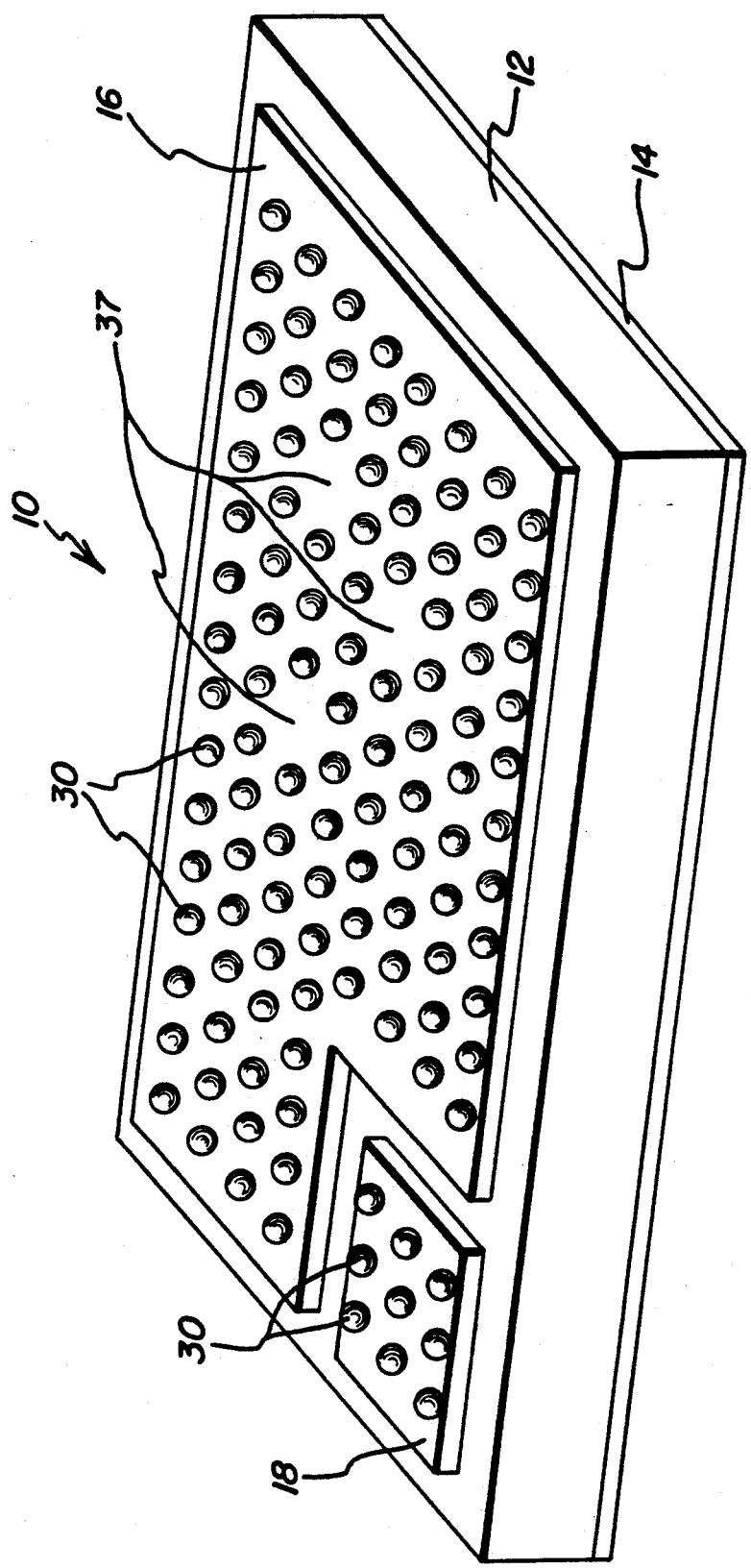

In FIG. 2, the chip 10 is illustrated with a plurality of conductive bumps 30 bonded to each of the contact pads 16 and 18. In a preferred embodiment, each of the conductive bumps 30 is a gold "disk" having a smoothly curving, pancake-like upper surface. Each of these gold bumps may preferably be formed in accordance with the teachings of U.S. Pat. No. 4,750,666 to Neugebauer et al., which is incorporated herein by reference. As is explained in more detail therein, a gold wire bonder is used to form these bumps. First, a gold ball is formed on the end of the gold wire and bonded to the contact pad 16 or 18 in the same fashion as it would be bonded thereto if a gold wire bond were being formed. However, once the bump has been bonded to the contact pad, rather than releasing the wire for movement through the bonding head (while the bonding head moves to the location of the other end of the wire bond) as is done in forming a wire bond, the wire is held fixed and the bonding head is moved laterally to shear the wire from the bump. This leaves a bump with a substantially smooth upper surface. Alternatively, the wire may be broken by pulling vertically or melting. A pigtail of wire may be left on the bump so long as it does not interfere with the subsequent steps in the fabrication process.

Conductive bumps other than gold may be employed if desired. However, gold bumps are preferred at this time because of the well established gold wire bonding techniques which are easily adapted to formation of gold bumps and because where thermocompression bonding is used to bond to the gold bumps, that thermocompression bonding is easier with gold bumps than with flat metallization. The use of gold bumps is also preferred because there is no yield loss at the wafer level. Alternatively, chromium/copper metallization could be used with its attendant yield loss during processing at the wafer level in combination with solder bonding.

The size of the gold bumps 30 is somewhat dependent on the diameter of the gold wire used in creating the gold bumps. With 1 mil (0.025 mm) diameter gold wire, a bump about 3 mils (0.075 mm) in diameter at the pad surface and 1 mil (0.025 mm) high is produced. The use of larger diameter wire provides a larger diameter, taller bump. The individual gold bumps 30 are preferably produced by an automatic wire bonding machine which has been programmed to position the bumps in the desired locations. A wire bonding machine such as the K&S Model 1419, is very effective for this purpose, since it is externally programmable with the program in use depending on the disk inserted in its disk drive. This machine is rated to produce two wire bonds per second and is capable of forming more gold bumps than that per second because a gold bump is formed every time the bonding head is brought in contact with the device, as distinguished from the situation with wire bonds where two contacts with the device or its package are needed to produce a single wire bond. Thus, a very effective production process results, especially since use of gold bumps makes the provision of a solderable metallization on contact pads 16 and 18 unnecessary and thereby saves fabrication steps during the fabrication of the semiconductor chip 10.

Referring once again to FIG. 2, there are three intentional voids 37 left in the pattern of gold bumps on the large pad 16. The purpose of these voids will be discussed subsequently. While the gold bumps 30 are illustrated as being disposed in an orderly array, they may be randomly positioned, if desired.

Figure 3:
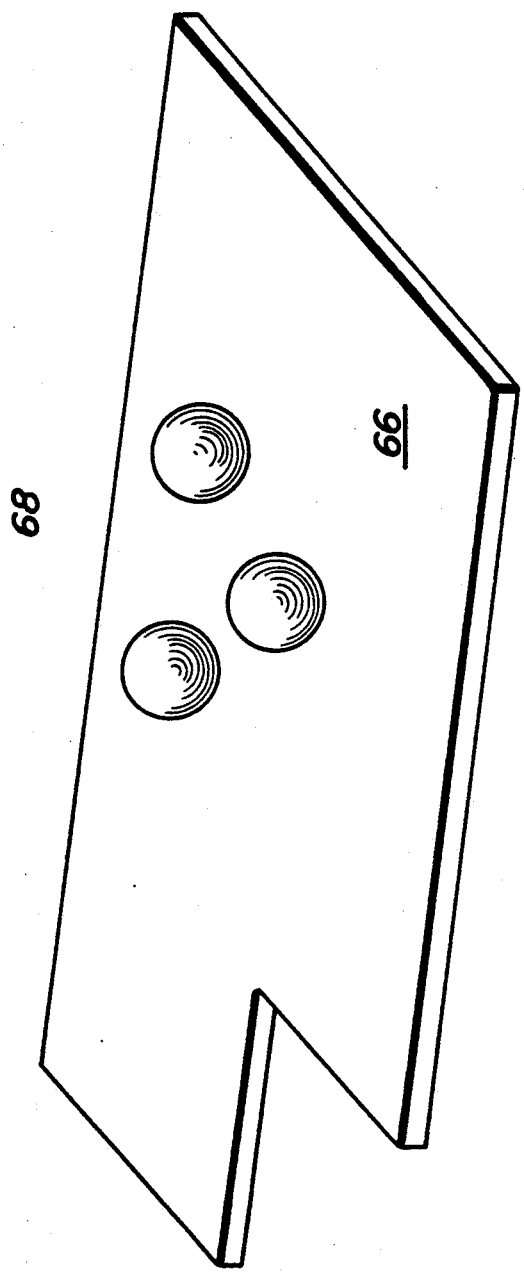

In FIG. 3, a copper foil electrode 66 is illustrated. The electrode 66 is configured to mate with the contact pad 16. While the electrode 66 is shown as being the same size and shape as the pad 16 in the subsequent illustrations, it may be made smaller or a different shape, if desired, so long as it still performs its desired function. Three protrusions 68 extend upward from the foil 66 in FIG. 3. These protrusions are preferably either integral with the foil 66 or solderless bonded to that foil.

As used in this specification and the appended claims, "solderless bond" or "solderless bonded" means without solder, i.e. a direct bond. Thus, solderless bonded includes thermocompression bonded, ultrasonically bonded, thermosonically bonded, diffusion bonded, cold welded, resistance welded, laser welded, spot welded, direct bonded and any other similar bonding process. The term "direct bonded" is used to refer to the direct bond copper process described in the patents listed below. The protrusions 68 may preferably be copper conductive pellets which are direct bonded to the copper foil 66. The term "pellet" is used in this specification and the appended claims as a general term for a small body, without limitation as to its explicit geometric shape. Thus, the term "pellet" includes a ball, a sphere, a cylinder, parallelepipeds, irregular shapes and regular geometric solids such as dodecahedrons and so forth. It also includes both solid and hollow bodies. However, it is generally preferred that the conductive pellets be solid bodies both for ease of their own manufacture and to avoid any question of the presence of a contaminating atmosphere within a pellet escaping into the package. It is preferred to have the pellets spheroid in the sense of having a maximum width in a plane through the center of the pellet which is no more than 2 or 3 times the minimum width in a plane through the center of the pellet. For a sphere, this maximum width/minimum width ratio is 1. The pellets also preferably have a thickness which is greater than the thickness of the insulating substrate portion of the lid (to be discussed subsequently) so that they extend beyond the substrate on both sides of the substrate.

Figure 4:
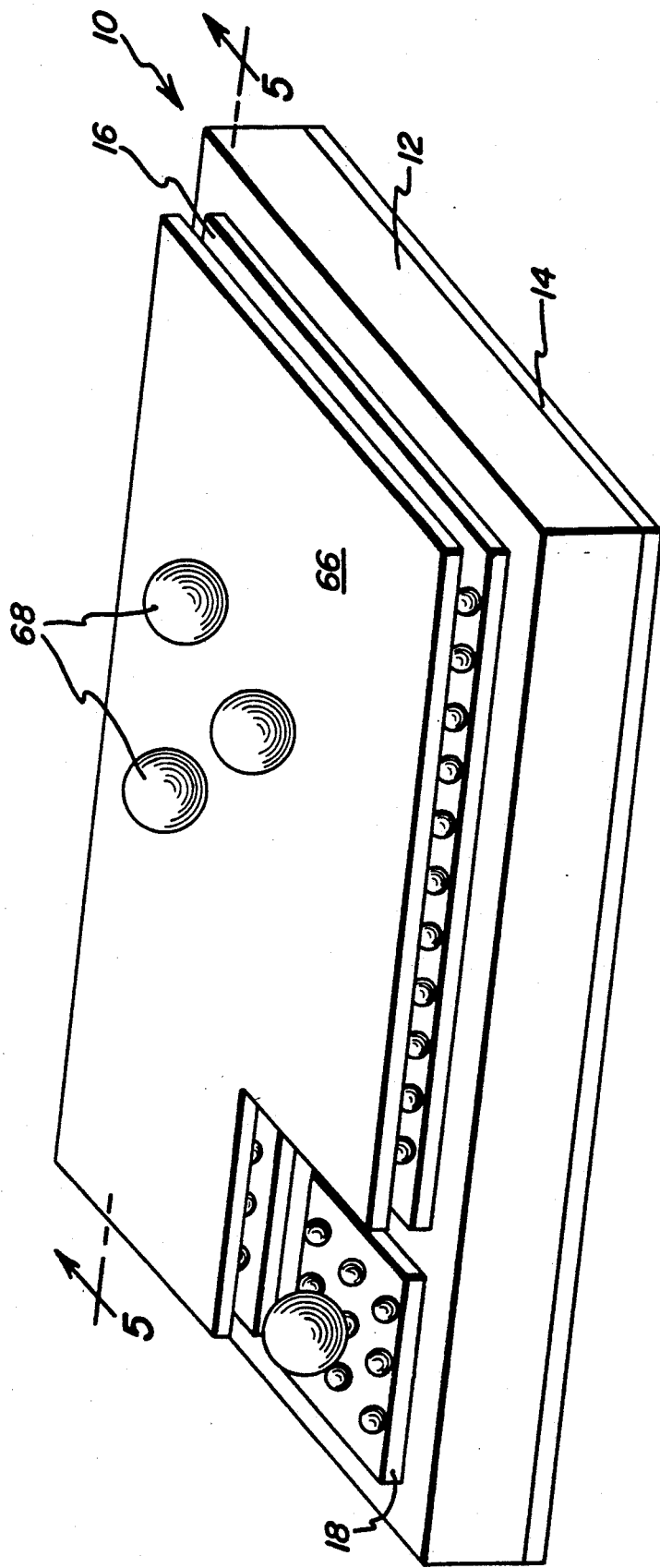

In FIG. 4, the chip 10 is illustrated with the conductive foil 66 bonded in place on the pad 16 and with a conductive pellet 62 bonded in place on the pad 18. The foil 66 is preferably solderless bonded to the pad 16 by the conductive gold bumps, and in particular, thermocompression bonding is a preferred technique of forming this bond. The pellet 62 is preferably also solderless bonded to the pad 18 via the gold bumps 30 thereon. The conductive foil 66 and the pellet 62 are preferably aligned with the contact pads 16 and 18, respectively, using a template or other alignment fixture which ensures proper alignment between the foil and the pad and the pellet and the pad, respectively. A template of this general type is illustrated in the above-identified related application Ser. No. 07/367,525.

Figure 5:
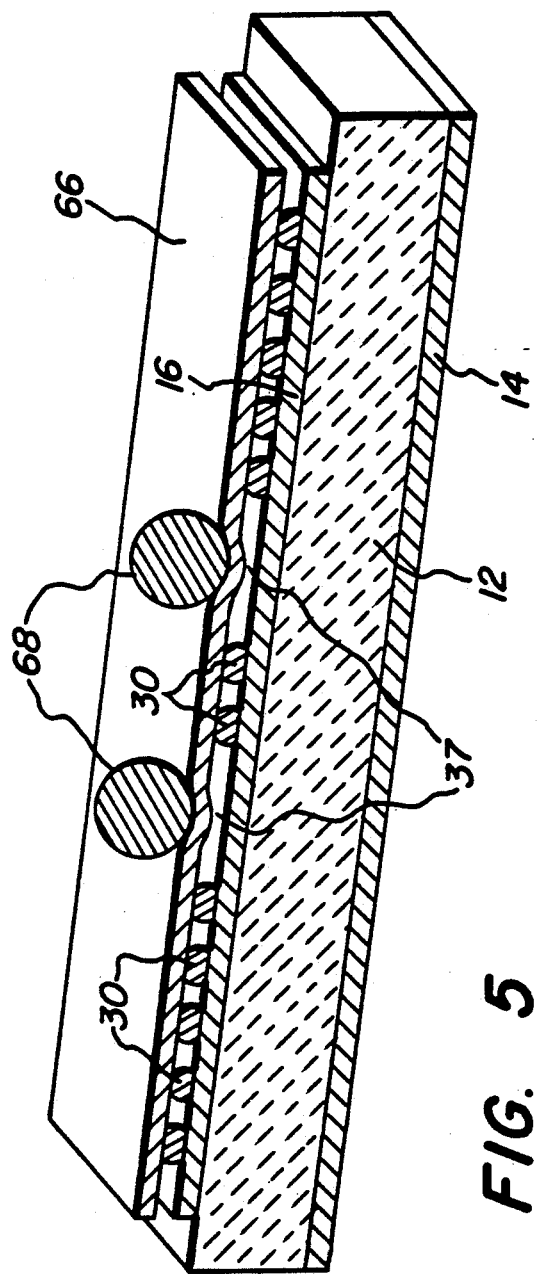
Figure 6:
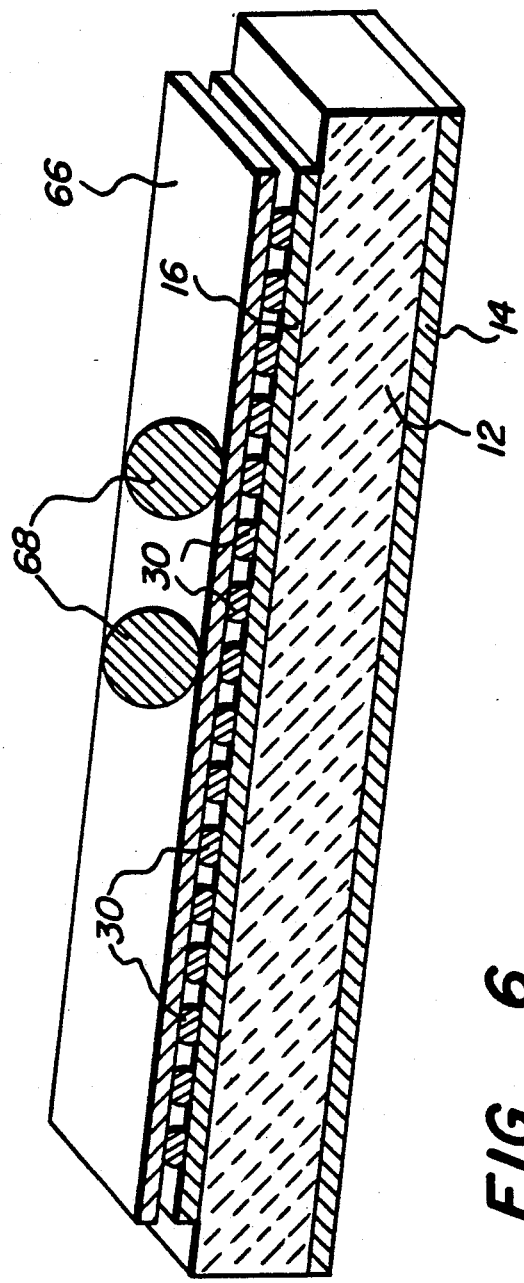

FIG. 5 is a cross-section through the structure of FIG. 4 taken along the line 5—5. In this illustration the absence of gold bumps 30 in the voids 37 under the two protrusions 68 is clearly illustrated. This is considered desirable to provide additional compliance during subsequent fabrication steps. Alternatively, gold bumps 30 may be provided in alignment with the protrusions 68 as is shown in FIG. 6, with an accompanying slight loss in compliance in subsequent packaging steps.

Figure 7:
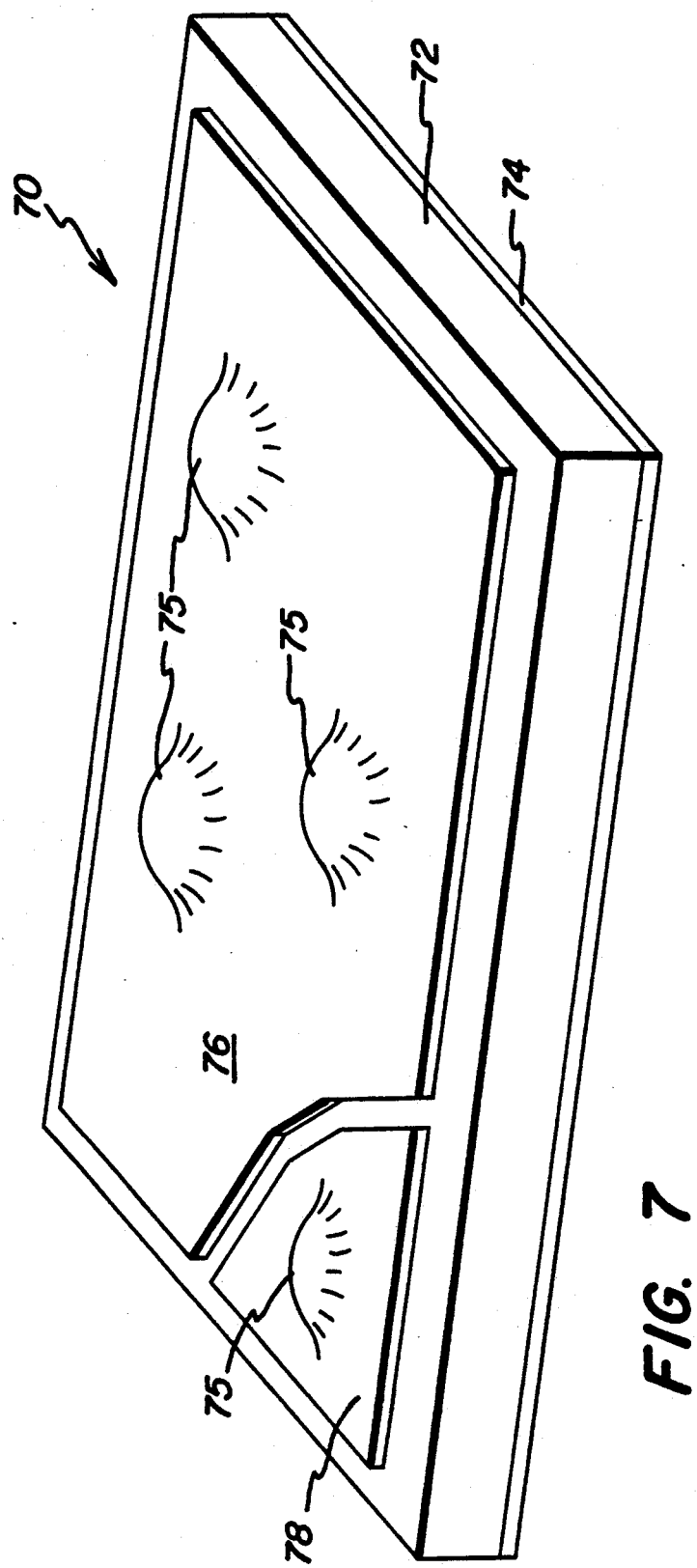
Figure 8:
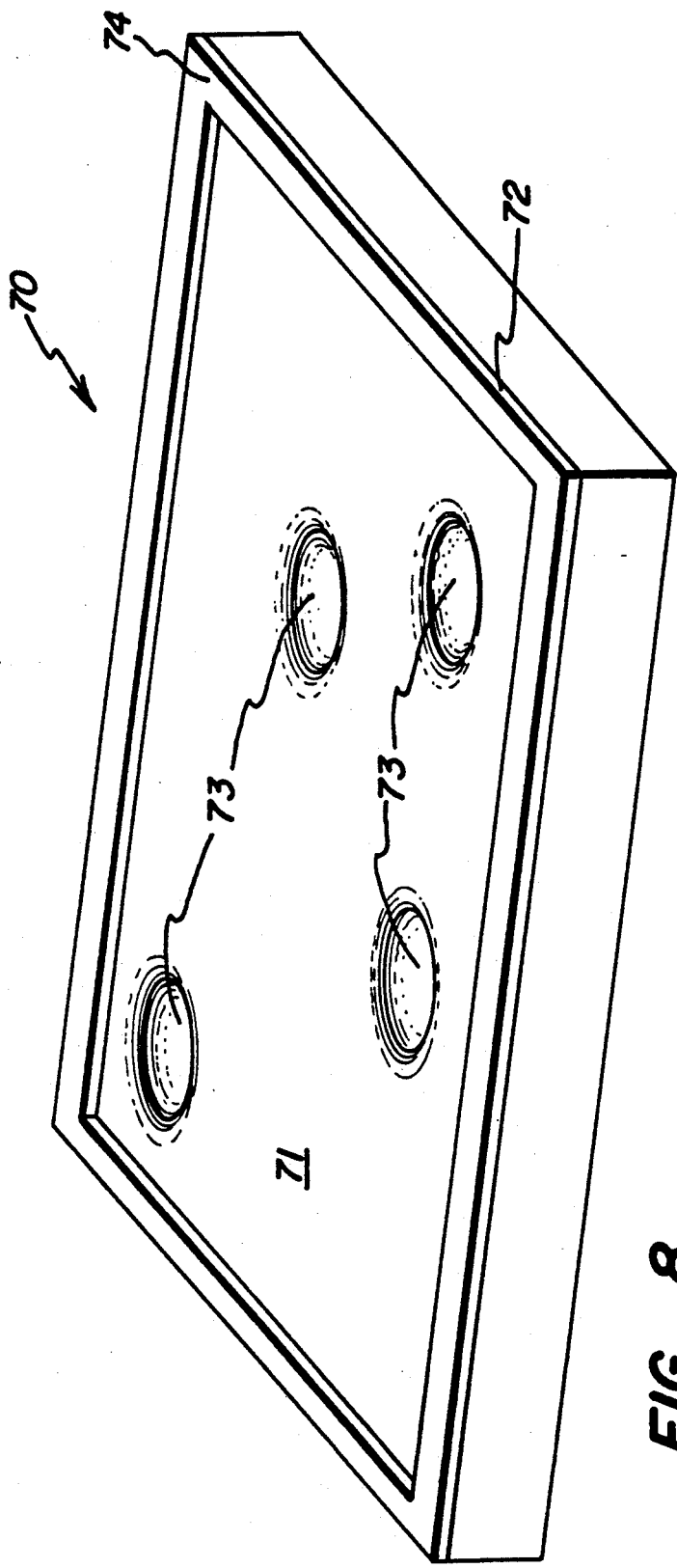

In FIG. 7, a lid 70 for the inventive package is illustrated in a perspective view of its upper or outer surface. In FIG. 8, the same lid 70 is illustrated in an inverted configuration in which the lower or inner surface 71 of the lid is visible. The lid 70 comprises a ceramic plate 72 having apertures 73 disposed therein. A frame 74 of copper or other solderable material is disposed along the periphery of the inner surface 71. On the outer surface (FIG. 7), two copper foil terminals 76 and 78 are direct bonded to the ceramic plate 72. The terminals 76 and 78 are preferably copper foil on the order of 1-25 mils (0.025-0.63 mm) thick which has been direct bonded to the ceramic substrate 72 by the direct bond copper process described in U.S. Pat. No. 3,744,120 to Burgess et al., U.S. Pat. Nos. 3,766,634 and 3,993,411 to Babcock et al, U.S. Pat. Nos. 3,854,892 and 3,911,553 to Burgess et al., U.S. Pat. Nos. 3,994,430 and 4,129,243 to Cusano et al., U.S. Pat. No. 4,409,278 to E. P. Jochym and U.S. Pat. No. 4,563,383 to Kuneman et al. Each of these patents is incorporated herein by reference. Alternatively, the copper foil could be brazed to the ceramic using the molybdenum manganese process, for instance. The only limitation on the process used to bond the foil to the ceramic being that a hermetic seal must be produced for a hermetic package. It is preferred for reasons discussed hereinafter that the foil terminals 76 and 78 be flexible where they extend across the apertures in the lid.

In order for the package 90 to be hermetically sealed, the conductive foils 76 and 78 must provide a hermetic seal enclosing the apertures 73 within the package. For this purpose, it is preferred to have each of the apertures positioned 100 mils or more from the nearest edge of the foil terminal which covers it. This is because we have found that in direct bonding copper to alumina plates, a direct bond distance of 100 mils essentially ensures the provision of a hermetic seal every time. As the length of the shortest path from the aperture to the edge of the foil terminal decreases, the yield percentage of hermetically sealed lids decreases. Consequently, the 100 mils distance is not a hard and fast limit, but is a desirable one where the package configuration permits its use, since it makes pretesting of lids for hermetic seals unnecessary. This distance may be shortened where necessary, with an attendant yield loss or, if improved methods of direct bonding are developed, may be shortened as the path length needed to ensure a hermetic seal decreases. While in this embodiment the hermetic seal is provided by the foil which forms the outside of the package at that location, that seal may be provided anywhere between the chip and the outside surface of the package, including within the aperture or inside the package.

When assembled, the foil 76 is electrically connected to the contact pad 16 via the protrusions 68 and the foil 66. The foil electrode 78 is connected to the contact pad 18 in the assembled condition via the conductive pellet 62. The apertures 73 are arranged in the plate 72 to align with the protrusions 68 and the pellet 62 when the chip 10 is properly positioned in the package.

The dimples 75 in the copper foil terminals 76 and 78 are preferably formed by placing a dimpling jig into the lid apertures with sufficient pressure to dimple the dimples to about 80% of the expected final dimple height. In this way, when packaging tolerances result in the protrusions 68 and the pellet 62 extending a lesser than expected distance through the lid, contact is still made between the foil electrodes on the outside of the lid and the pellet or protrusions. Where the expected tolerances result, additional dimpling of about 20% takes place during the sealing of the package, thereby providing good contact between the foil electrodes 76 and 78 and the protrusions 68 and the pellet 62. Where the tolerances result in greater than expected protrusion of the protrusion 68 and the pellet 62 through the ceramic of the lid, more than 20% additional dimpling takes place in order to compensate for that tolerance situation.

Figure 9:
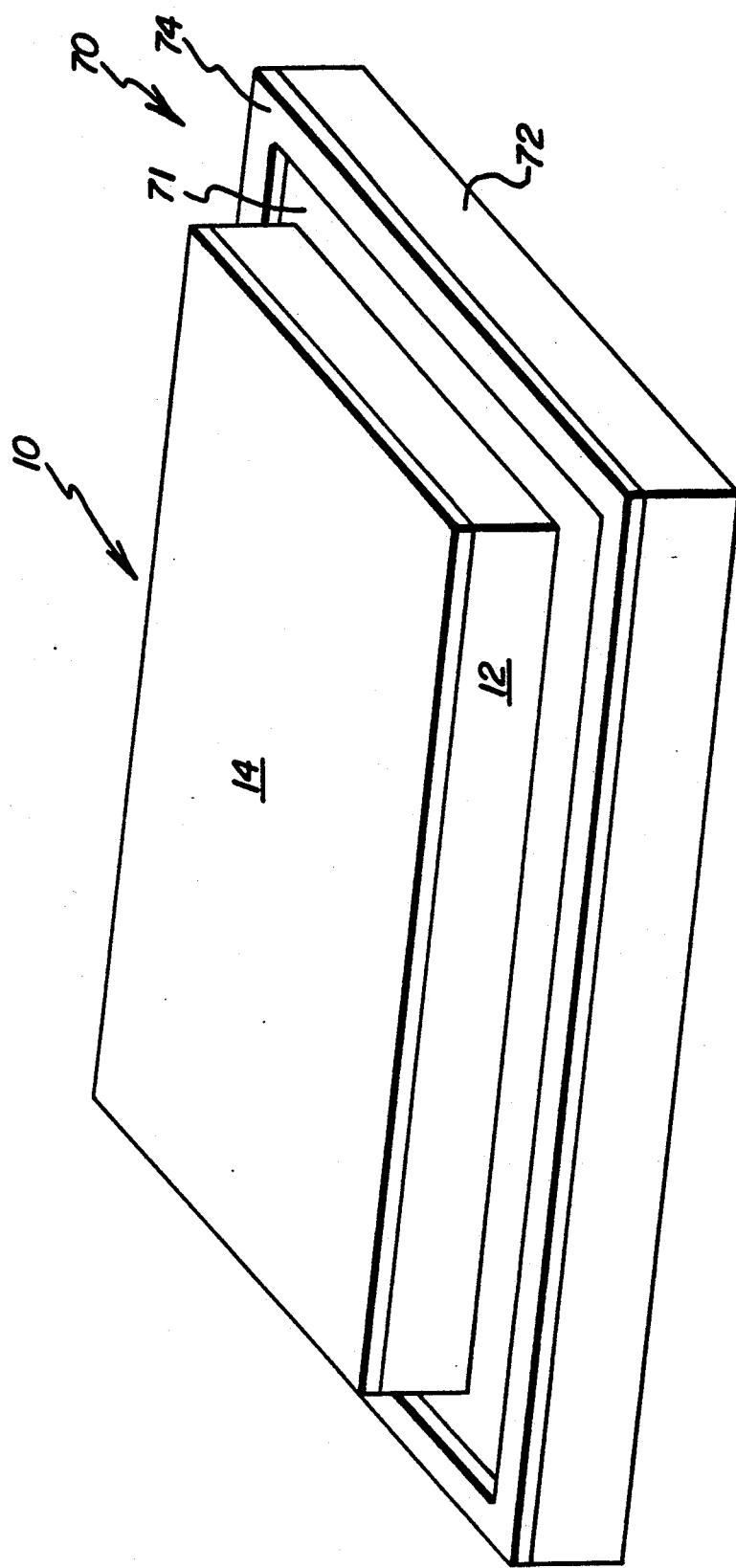

In FIG. 9, the chip of FIG. 4 is shown inverted within the lid 70 of FIG. 8. The chip is preferably bonded to the lid 70 in this configuration prior to mating the combination of the chip and lid with a package base. In mating the chip with the lid, the protrusions 68 and the pellets 62 are aligned with and inserted in the apertures 73 in the lid. This assures proper alignment between the chip and the lid in the final package. The chip may preferably be solderless bonded to the foil terminals on the outer surface of the lid via the conductive pellets 62 and protrusions 68 as by thermocompression bonding. However, if desired, the pellets may alternatively be bonded to the foil terminals of the lid by solder.

In FIG. 10, a package base 80 is shown in perspective view. The base 80 comprises a copper plate 82 having a frame 84 direct bonded to the upper surface thereof. The frame 84 is configured to mate with the frame 74 on the lower surface of the lid 70 and is provided with a height which provides an appropriate overall height for the cavity 85 within the package for containing the chip 10. A layer of solder 86 is disposed on the upper surface of the frame 84 in preparation for sealing the package. A solder preform or layer 88 is disposed on the base plate 82 in the central portion of the cavity 85 in the location in which the chip 10 will be disposed in the final package.

In FIG. 11, the combined lid and chip of FIG. 9 is shown inverted relative to its FIG. 9 orientation and placed with the chip in the cavity 85 and the lid frame 74 in alignment with the base frame 84. The package is sealed by heating the package to the melting point of the solder layers 86 and 88 in an appropriate atmosphere such as a vacuum or dry nitrogen. Flat external foil terminal extensions 96 and 98 are preferably soldered to the foil terminals 76 and 78 at the same time to provide low inductance terminals for the package. Alternatively, the terminals extensions 96 and 98 may be direct bonded to the foil terminals 76 and 78 at the same time the foil terminals are direct bonded to the ceramic substrate 72. The base plate extension beyond the cavity 85 containing the device may serve as the third lead of the device. This package is shown in cross-section in FIG. 12 to illustrate the presence of the foil electrode 66 within the package, the location of one of the protrusions 68 within an aperture 73 in the lid (and spaced from the aperture wall) and the manner in which the foil 66 may bend downward in the void 37 in the pattern of conductive bumps to provide additional compliance during the sealing of the package.

During the sealing of the package using solder, the solder pad 88 tends to draw the back metallization 14 of the chip 10 into alignment with it due to surface tension in the solder. Consequently, accurate alignment of the solder preform 88 with respect to the final position of the chip 10 is desirable in order to minimize strains within the package. The same solder tension effects draw the lid frame 74 into alignment with the base frame 84. Where the protrusions 68 comprise copper pellets or spheres similar to the pellets 62, these pellets may be soldered to the foil 66 rather than solderless bonded to the foil 66. In that situation, the solder which bonds the pellet to the coil will reflow during the sealing process as will the solder which bonds the pellet 62 to the pad 18. However, with the proper alignment which has been achieved during the fabrication process, no shifting of the chip relative to the pellets takes place during this sealing process. The pellet 62 may be aligned with and bonded to the pad 16 in the manner taught in the related application Ser. No. 07/367,525.

If it is desired to do so, the contact pad 16 may be made solderable and the foil 66 may be soldered to metallization 16 rather than being solderless bonded to it using thermocompression bonding.

Figure 13:
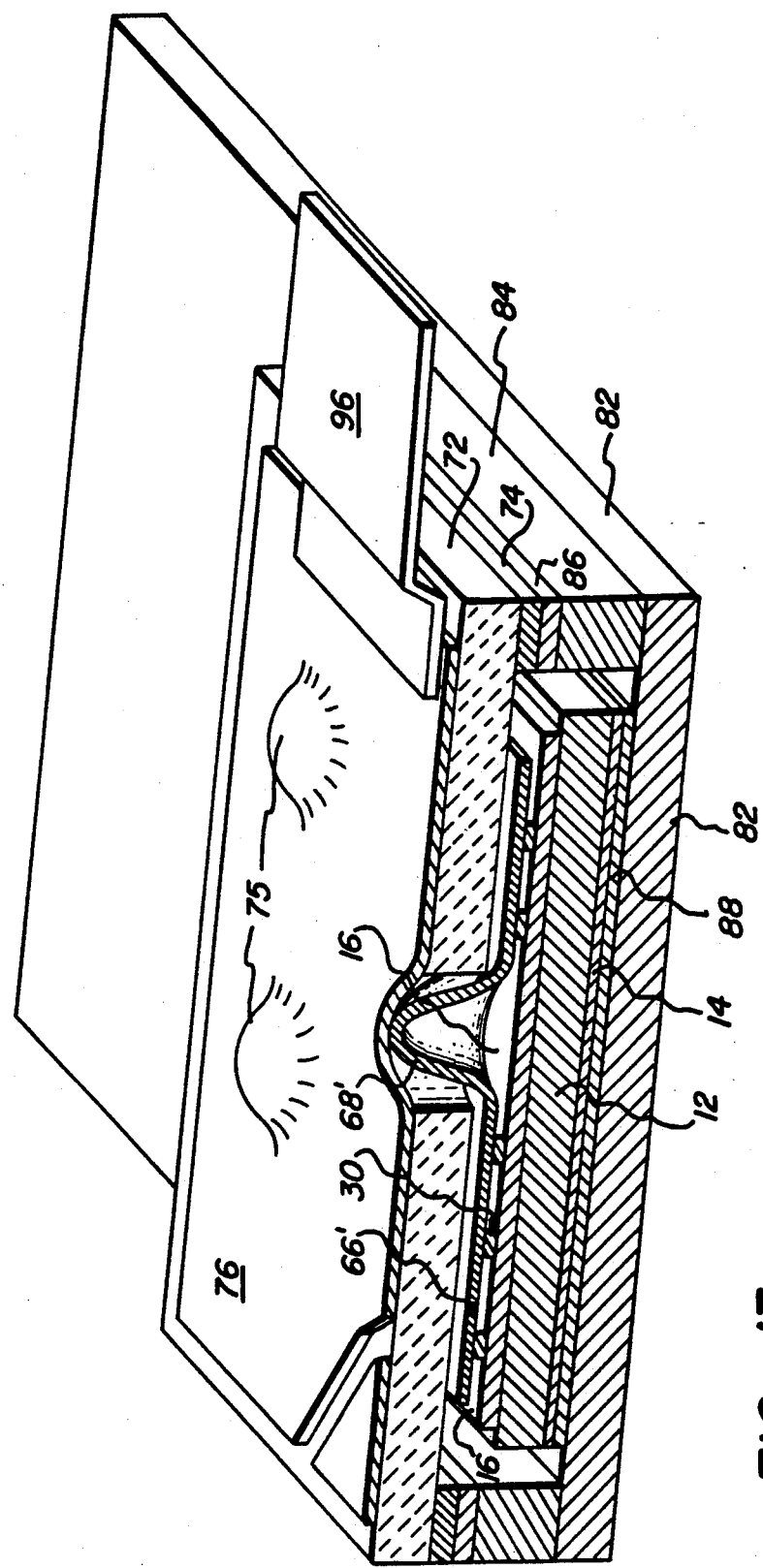
FIG. 13 is a view like FIG. 12 illustrating an alternative configuration for the internal foil.

An alternative configuration for the foil 66 and its protrusions 68 is illustrated in a perspective cross-section view in FIG. 13. In FIG. 13, a foil 66' has its protrusions 68 formed therein by forming or dimpling of the foil to produce hill-like protrusions 68'. Such a foil configuration has the advantage that the protrusions 68' are integral with the foil 66'. However, it also carries with it a possible attendant disadvantage that the protrusions 68 are less rigid than solid pellets 62 would be with the result that the protrusions 68 are less effective in transmitting pressure during the sealing operation from the dimples 75 to the chip base metallization 14.

Figure 14:
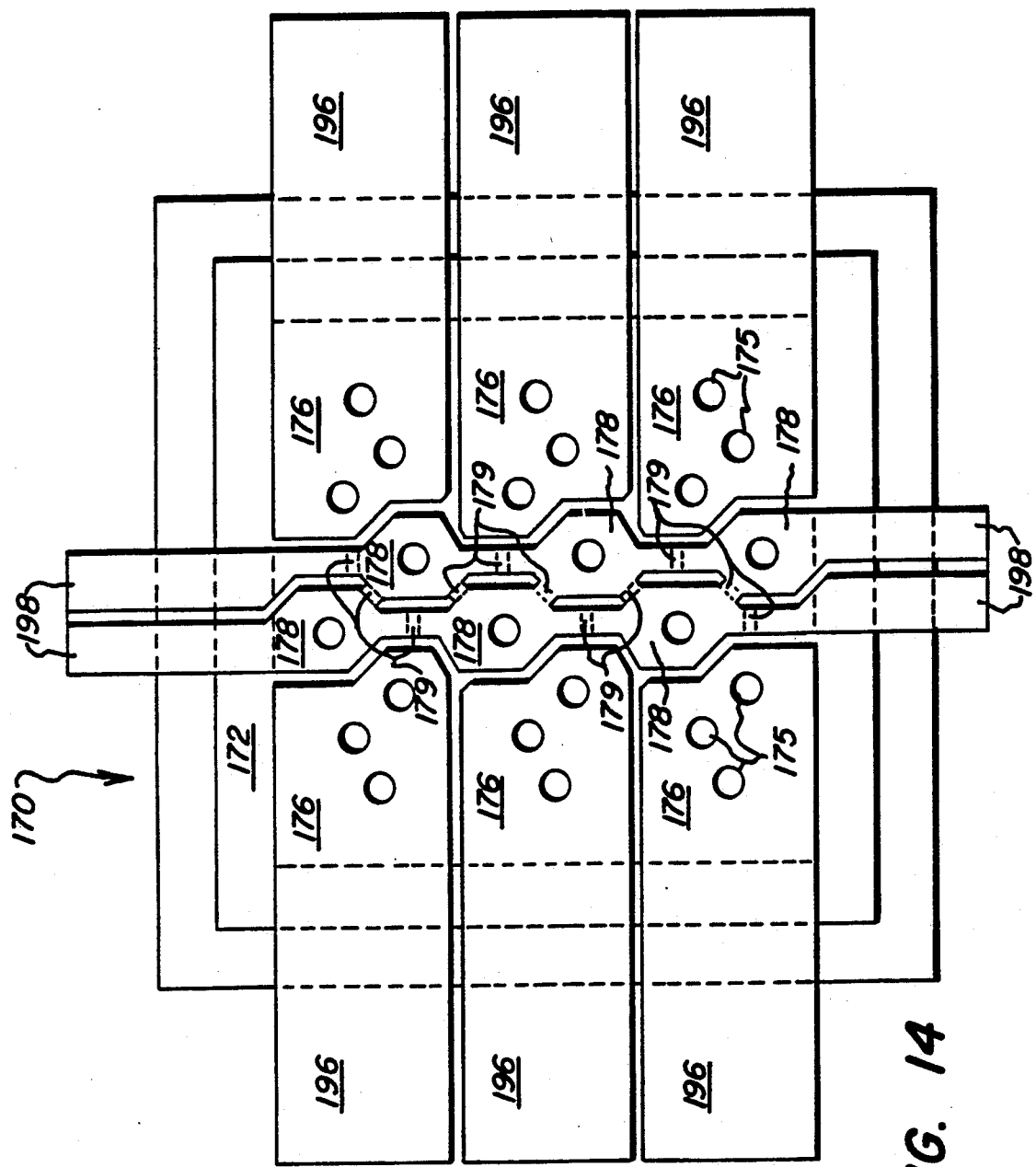
FIG. 14 is a plan view of an alternative lid configuration.

An alternative configuration for a lid in accordance with the invention is illustrated generally at 170 in FIG. 14 in plan view. The lid 170 is similar to the lid 70, except for being larger in major surface area and being designed for use with six individual device chips rather than a single device chip as is the case with the lid 70. The lid 170 comprises a single ceramic substrate 172 having six different source or power terminals 176 bonded to its upper surface and having a matrix of gate electrodes 178 disposed on its upper surface and bonded thereto to provide hermetic seals around apertures in the ceramic substrate 172. Each of the foil terminals 178 which surrounds one of the apertures in which a lead from a gate or control electrode will be disposed, is connected to other adjacent foil terminals 178 by bridges 179 which are designed to be removable in order to isolate a foil terminal 178 of a defective device in the event that after packaging, testing should indicate that one of the devices in the package does not operate properly. The bridges may merely be narrow regions in the foil or may be regions where the foil is spaced from the ceramic 172 to simplify severing a bridge. Each of the foil terminals 176 has a separate terminal extension 196 connected thereto. Six separate power device chips are packaged in this package with the upper power contact pad 16 thereof connected to an individual external foil terminal 176 and with the gate or control contact pad 18 of that chip connected to the adjacent external foil control terminal 178.

This lid structure permits discretionary connection of the packaged devices into the circuit into which the package is to be connected. In the event that one of the devices is found to be defective during post-packaging testing, the power terminal extension 196 for that device is preferably severed from the foil electrode 176 for that device in a manner which ensures that the foil terminal 176 for that defective device will not be connected into the circuit. Similarly, the bridges 179 which connect the control foil terminal 178 for that device to the terminal extensions 198 and the directly adjacent terminal extension 198, if necessary, are severed to leave the gate electrode for that device unconnected also. This assures that the defective device is isolated, and does not affect circuit operation.

While the lid 170 has been described in terms of having six separate device chips packaged therewith, this same lid configuration may be used with six different devices in a single piece of silicon. The discretionary connection features of the lid 170 then permits a defective device within the silicon chip to be isolated from the external circuit by separating its gate foil terminal 178 from the gate terminal extensions 198 and by severing its power terminal extension 196 from its foil terminal 176. This discretionary connection technique may be used in either of two ways. In the first manner, the device chip is fully tested and only chips in which all six devices test as good are packaged. Under these conditions, only devices which prove defective under conditions which cannot be tested in wafer, unpackaged form, will show up in the package and those devices may be isolated in the manner which has been described. Alternatively, the ratings of the individual devices may be such that as long as five of the six devices are good, the completed package will meet its specifications. Under these conditions, chips having five good devices and one defective device may be packaged in this package and the defective device isolated in the manner which has been described. Similar considerations would apply if three or four of the devices are sufficient to meet the overall package specification.

The related application Ser. No. 07/367,525 describes a technique for discretionary bonding of devices by controlling the connection of the contact pad on the device to the external foil terminal. The present package provides discretionary connection as part of the external terminal structure. These two separate discretionary connection techniques may be used in the same device package with internal non-connection being used to exclude those devices which test as defective during wafer or chip testing and the external discretionary technique being used to disconnect any devices which subsequently test to be defective, even though at chip or wafer test, they appeared to be good devices. While in the lid 170 in FIG. 14, each of the six devices to be connected in the package is provided with a separate power terminal 196, two or more devices may be connected to a single set of leads with all of the devices connected to that set of leads being disconnected in the event that one of those devices turns out to be defective. Such a lid structure is particularly effective where discretionary connection is utilized inside the package as well, since a more compact package structure may result and defective devices at wafer test may be isolated from the external terminals by the discretionary internal non-connection. In this manner, the most effective use of the package space may be made while simultaneously providing the ability to package as many devices as possible in the package.

While this package has been described in terms of being sealed with solder along the base of the chip and at the joint between the lid and base frames, it may alternatively be assembled using exclusively solderless bonded connections through the use of thermocompression bonding using gold coated bonding surfaces.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A packaged semiconductor chip comprising:
   a contact pad on a first surface of said chip;
   a conductive foil aligned with and bonded to said contact pad;
   a lid including an electrically insulating substrate having first and second major surfaces and an aperture therein, said substrate disposed with said first major surface toward said chip with said aperture disposed in alignment with said conductive foil;
   a conductive protrusion electrically continuous with said foil extending into said aperture; and
   a package base;
   said lid being bonded to said package base in a manner to enclose said chip and said conductive foil within said package.

2. The packaged chip recited in claim 1 wherein:
   said conductive protrusion is integral with said foil.

3. The packaged chip recited in claim 1 wherein:
   said conductive protrusion comprises a conductive pellet bonded to said foil.

4. The packaged chip recited in claim 3 wherein:
   said conductive pellet is solderless bonded to said foil.

5. The packaged chip recited in claim 1 wherein:
   said foil is bonded to said contact pad by an intermediate conductive material.

6. The packaged chip recited in claim 5 wherein:
   said intermediate conductive material comprises an array of conductive bumps bonded to said contact pad.

7. The packaged chip recited in claim 6 wherein:
   said intermediate conductive material comprises solder.

8. The packaged chip recited in claim 6 wherein:
   said intermediate conductive material comprises gold.

9. The packaged chip recited in claim 6 wherein:
   said conductive protrusion comprises a conductive pellet; and
   said array of conductive bumps does not extend into alignment with said conductive pellet.

10. The packaged chip recited in claim 6 further comprising:
    an external conductor adhered to said second major surface of said lid and electrically connected to said protrusion.

11. The packaged chip recited in claim 10 wherein:
    said external conductor is bonded to said protrusion.

12. The packaged chip recited in claim 11 wherein:
    said external conductor is solderless bonded to said protrusion.

13. The packaged chip recited in claim 11 wherein:
    said external conductor is soldered to said protrusion.

14. The packaged chip recited in claim 1 comprising:
a plurality of said conductive protrusions each of which extends into an aperture in said substrate.

15. The packaged chip recited in claim 14 wherein:
each of said protrusions comprises a conductive pellet.

16. The packaged chip recited in claim 15 wherein:
said conductive pellet is roughly spherical.

17. The packaged chip recited in claim 15 wherein:
said conductive pellet is a spheroid.

18. The packaged chip recited in claim 15 wherein:
said conductive pellet is roughly cylindrical.

19. The packaged chip recited in claim 15 wherein:
said conductive pellet is substantially a parallelepiped.

20. The packaged chip recited in claim 1 wherein:
said chip is hermetically sealed within said package.

21. The packaged chip recited in claim 1 wherein:
the area of said foil is substantially larger than the area of said aperture.

22. A packaged semiconductor chip comprising:
a contact pad on a first surface of said chip;
a conductive foil aligned with and bonded to said contact pad;
a lid including an electrically insulating substrate having first and second major surfaces and an aperture therein, said substrate disposed with said first major surface toward said chip with said aperture disposed in alignment with said conductive foil;
a conductive protrusion electrically continuous with said foil extending into said aperture and neither filling nor sealing said aperture;
an external conductor adhered to said second major surface of said substrate, extending across and sealing said aperture and electrically connected to said protrusion; and
a package base;
said lid being bonded to said package base in a manner to enclose said chip and said conductive foil within said package.

23. The packaged chip recited in claim 22 wherein:
said external conductor is bonded to said protrusion.

24. The packaged chip recited in claim 23 wherein:
said external conductor is solderless bonded to said protrusion.

25. The packaged chip recited in claim 23 wherein:
said external conductor is soldered to said protrusion.

26. The packaged chip recited in claim 22 comprising:
a plurality of devices contained within said package;
a separate external conductor adhered to said second major surface of said substrate for each of said devices, each of said devices having a conductive foil aligned with and bonded to a contact pad thereon, each of said conductive foils having a conductive protrusion electrically continuous with that foil extending into an aperture in said lid and connected to the external conductor associated with that device.

27. The packaged chip recited in claim 26 wherein:
said package includes an external control terminal having removable segments for isolating the control electrodes of selected devices.

* * * * *